(12) United States Patent
Sasaki et al.

(10) Patent No.: US 10,269,554 B2
(45) Date of Patent: Apr. 23, 2019

(54) METHOD FOR MANUFACTURING SIC EPITAXIAL WAFER AND SIC EPITAXIAL WAFER

(71) Applicant: SHOWA DENKO K.K., Minato-ku, Tokyo (JP)

(72) Inventors: Yuzo Sasaki, Hikone (JP); Susumu Sugano, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/329,363

(22) PCT Filed: Jun. 19, 2015

(86) PCT No.: PCT/JP2015/067765
§ 371 (c)(1),
(2) Date: Jan. 26, 2017

(87) PCT Pub. No.: WO2016/017319
PCT Pub. Date: Feb. 4, 2016

(65) Prior Publication Data
US 2017/0221697 A1      Aug. 3, 2017

(30) Foreign Application Priority Data
Jul. 28, 2014   (JP) ................................. 2014-153289

(51) Int. Cl.
*C30B 25/02*        (2006.01)
*H01L 21/02*        (2006.01)
(Continued)

(52) U.S. Cl.
CPC .......... *H01L 21/02021* (2013.01); *B24B 9/00* (2013.01); *B24B 9/065* (2013.01);
(Continued)

(58) Field of Classification Search
CPC ...... C30B 25/02; H01L 29/1608; H01L 29/30
See application file for complete search history.

(56) References Cited

U.S. PATENT DOCUMENTS

2007/0290211 A1   12/2007   Nakayama et al.
2009/0156104 A1   6/2009    Kim et al.
(Continued)

FOREIGN PATENT DOCUMENTS

JP      05-152259 A     6/1993
JP      2005-311348 A   11/2005
(Continued)

OTHER PUBLICATIONS

International Search Report for PCT/JP2015/067765 dated Sep. 8, 2015.
(Continued)

*Primary Examiner* — Robert M Kunemund
(74) *Attorney, Agent, or Firm* — Sughrue Mion, PLLC (57) ABSTRACT

In order to reduce edge defects efficiently and sufficiently, a method for manufacturing a SiC epitaxial wafer according to the present invention is a method for manufacturing a SiC epitaxial wafer that forms a SiC epitaxial layer on top of a SiC single crystal substrate having an off angle, and includes a rough polishing step for subjecting an outer circumferential edge on a starting side of step-flow growth in the SiC single crystal substrate to rough polishing before forming the SiC epitaxial layer; and a final polishing step for further polishing for finish.

7 Claims, 8 Drawing Sheets (51) Int. Cl.
　　　*B24B 9/00*　　　(2006.01)
　　　*C30B 25/20*　　(2006.01)
　　　*C30B 29/36*　　(2006.01)
　　　*B24B 9/06*　　　(2006.01)
　　　*B24D 3/06*　　　(2006.01)
　　　*B24D 3/28*　　　(2006.01)
　　　*C30B 33/00*　　(2006.01)
　　　*H01L 29/16*　　(2006.01)
　　　*H01L 29/34*　　(2006.01)
　　　*C23C 16/02*　　(2006.01)
　　　*C23C 16/32*　　(2006.01)
　　　*C30B 25/18*　　(2006.01)
　　　*H01L 29/04*　　(2006.01)

(52) U.S. Cl.
　　CPC ................ *B24D 3/06* (2013.01); *B24D 3/28* (2013.01); *C23C 16/0254* (2013.01); *C23C 16/325* (2013.01); *C30B 25/186* (2013.01); *C30B 25/20* (2013.01); *C30B 29/36* (2013.01); *C30B 33/00* (2013.01); *H01L 21/02378* (2013.01); *H01L 21/02433* (2013.01); *H01L 21/02529* (2013.01); *H01L 21/02658* (2013.01); *H01L 21/02664* (2013.01); *H01L 29/1608* (2013.01); *H01L 29/34* (2013.01); *H01L 29/045* (2013.01)

(56) References Cited

U.S. PATENT DOCUMENTS

| | | | |
|---|---|---|---|
| 2013/0264584 A1* | 10/2013 | Okita | H01L 29/1608 257/77 |
| 2014/0073228 A1 | 3/2014 | Okita et al. | |
| 2014/0117380 A1* | 5/2014 | Loboda | H01L 21/30625 257/77 |

FOREIGN PATENT DOCUMENTS

| | | |
|---|---|---|
| JP | 2009-142979 A | 7/2009 |
| JP | 2009-164528 A | 7/2009 |
| JP | 2010-017779 A | 1/2010 |
| JP | 2010-195598 A | 9/2010 |
| JP | 2011-219297 A | 11/2011 |
| JP | 2012-051795 A | 3/2012 |
| JP | 2013-219206 A | 10/2013 |
| JP | 2014-033220 A | 2/2014 |
| JP | 2014-058411 A | 4/2014 |

OTHER PUBLICATIONS

Notice of Allowance dated Jan. 15, 2019 from the Japanese Patent Office in Japanese application No. 2018-053498.

* cited by examiner

METHOD FOR MANUFACTURING SIC EPITAXIAL WAFER AND SIC EPITAXIAL WAFER

TECHNICAL FIELD

The present invention relates to a method for manufacturing a SiC epitaxial wafer, and a SiC epitaxial wafer.

This application is a National Stage of International Application No. PCT/JP2015/067765, filed on Jun. 19, 2015, which claims priority from Japanese Patent Application No. 2014-153289, filed Jul. 28, 2014, the content of which is incorporated herein by reference.

BACKGROUND ART

Silicon carbide (SiC) has excellent physical properties to exhibit a band gap about three times wider, dielectric breakdown field strength about ten times stronger and thermal conductivity about three times greater, than those of silicon (Si). Therefore, the applications of SiC to a power device, a high frequency device, a high-temperature operation device or the like have been expected.

For the promotion of practical application of SiC devices, it is essential to establish a high-quality crystal growth technique and a high-quality epitaxial growth technique.

SiC has a number of polytypes. The polytype mainly used for producing a practical SiC device is 4H—SiC. A substrate of a SiC device is prepared by forming a SiC epitaxial film to serve as an active region of the SiC device through a chemical vapor deposition (CVD) method, on a SiC single crystal substrate processed from a bulk crystal produced by the sublimation method or the like. Polytypes different from the polytype used in the substrate are easily introduced into the epitaxial film. For example, in the case of using the 4H—SiC polytype in the substrate, polytypes of 3C—SiC and 6H—SiC are introduced. In order to suppress the introduction of these polytypes, epitaxial growth is generally performed by slightly tilting the crystal face of the SiC single crystal substrate to allow step-flow growth (growth in the lateral direction from the atomic steps).

In the crystals of SiC, for example, as described in Patent Document 1, various types of defects are present, including point defects such as carbon vacancies and mixed impurity atoms, linear defects such as threading screw dislocations, threading edge dislocations and basal plane dislocations, and planar defects such as stacking faults. There are the so-called triangular defects among these defects. A triangular defect is a defect that is formed with a characteristic surface morphology on the surface of an epitaxial layer on a vicinal SiC single crystal substrate having an off angle.

It has been required to reduce these defects since they adversely affect the properties, yield and reliability and the like of SiC devices.

In recent years, in order to increase the effective area of the wafer, reduction of the edge exclusion (ineffective region in the periphery of the semiconductor wafer, usually represented by the distance from the edge), together with an increase in the size of the wafer has been desired.

If it is possible to reduce the edge exclusion, the effective area ratio for producing chips increases, and the yield of the semiconductor chip is improved. For this reason, it has been required to make the width of the edge exclusion even smaller.

CITATION LIST

Patent Documents

[Patent Document 1] Japanese Unexamined Patent Application, First Publication No. 2012-51795
[Patent Document 2] Japanese Unexamined Patent Application, First Publication No. Hei 5-152259
[Patent Document 3] Japanese Unexamined Patent Application, First Publication No. 2010-17779

SUMMARY OF INVENTION

Technical Problem

Under the above-described demand for making the width of the edge exclusion even smaller, it has become necessary to conduct studies in order to even reduce a variety of defects present in the vicinity of the edge of the SiC epitaxial wafer. As a result of the studies, the inventors of the present invention have found for the first time that there are defects characteristically occurring in the vicinity of a predetermined edge of the SiC epitaxial wafer (hereinafter, referred to as "edge defects").

As a result of intensive studies and analysis conducted on these edge defects, the inventors of the present invention have found that these edge defects occurred intensively in the outer circumferential edge on the starting side of the step-flow growth in the SiC epitaxial wafer that forms a SiC epitaxial layer on top of the SiC single crystal substrate having an off angle.

Appearance of such edge defects in a characteristic manner in a predetermined position of the substrate has not been conventionally found. Or, it has not been regarded as a problem even if it has been discovered. Therefore, a method for effectively improving the method to reduce these edge defects has not been proposed at all.

With the recent technical advances, a method for manufacturing a SiC epitaxial wafer which can effectively improve these edge defects has been earnestly desired. In order to make the edge exclusion width even smaller, SiC epitaxial wafers with less of these edge defects have been eagerly desired.

The present invention takes the above problems into consideration, with an object of providing a method for manufacturing a SiC epitaxial wafer that can reduce the edge defects efficiently and sufficiently. Another object is to provide a SiC epitaxial wafer with sufficiently reduced edge defects and having a high effective area ratio for producing chips.

Solution to Problem

As a result of intensive studies, the inventors of the present invention have found that the edge defects occurred intensively in the outer circumferential edge on the starting side of the step-flow growth in the SiC epitaxial wafer that forms a SiC epitaxial layer on the SiC single crystal substrate having an off angle, and focused on the outer circumferential edge.

As a result, the inventors have found that by subjecting the outer circumferential edge to rough polishing and then to final polishing, the edge defects can be reduced efficiently, thereby completing the present invention.

That is, the present invention provides the following means in order to solve the above problems.

(1) A method for manufacturing a SiC epitaxial wafer according to the present invention is a method for manufacturing a SiC epitaxial wafer that forms a SiC epitaxial layer on a SiC single crystal substrate having an off angle, the method including: a rough polishing step for subjecting an outer circumferential edge on the starting side of step-flow growth in the SiC single crystal substrate to rough polishing before forming the SiC epitaxial layer; and a final polishing step for further polishing for finish.

(2) In the method for manufacturing a SiC epitaxial wafer according to the above (1), the final polishing may be performed by a grinding process in which a rotational axis of a polishing grindstone is inclined in a tangential direction of the outer circumference of the SiC single crystal substrate to be polished, with respect to a rotational axis of the SiC single crystal substrate to be polished.

(3) In the method for manufacturing a SiC epitaxial wafer according to the above (2), the final polishing step may be performed by inclining the rotational axis of the polishing grindstone by 1° to 45° in the tangential direction of the outer circumference of the SiC single crystal substrate to be polished, with respect to the rotational axis of the SiC single crystal substrate to be polished.

(4) In the method for manufacturing a SiC epitaxial wafer according to any one of the above (1) to (3), the final polishing step may be performed using a resin-bonded grinding stone.

(5) In the method for manufacturing a SiC epitaxial wafer according to any one of the above (2) to (4), a polishing abrasive grain used in the final polishing step may have a grain size of #2,000 to #5.000.

(6) In the method for manufacturing a SiC epitaxial wafer according to any one of the above (2) to (5), the machined surface roughness (Ra) after performing the final polishing step may be from 1 nm to 50 nm.

(7) In the method for manufacturing a SiC epitaxial wafer according to any one of the above (1) to (6), the rough polishing step may be performed using a metal bonded grinding stone.

(8) In the method for manufacturing a SiC epitaxial wafer according to any one of the above (1) to (7), a polishing abrasive grain used in the rough polishing step may have a grain size of #400 to #1,500.

(9) A SiC epitaxial wafer according to the present invention is a SiC epitaxial wafer obtained by forming a SiC epitaxial layer on a SiC single crystal substrate having an off angle, and the number of edge defects within a range of 1 mm from an outer circumferential edge on a step-flow growth starting side in the SiC single crystal substrate is not more than 30 defects/m.

Advantageous Effects of Invention

In the method for manufacturing a SiC epitaxial wafer according to the present invention, the outer circumferential edge on the step-flow growth starting side of the SiC epitaxial wafer is subjected to rough polishing, and then to final polishing. For this reason, it is possible to polish the outer circumferential edge without damaging the outer circumferential edge. Damage to the outer circumferential edge is considered to be the cause of the edge defects. Therefore, by having these polishing steps, the edge defects can be suppressed effectively.

The final polishing step may be performed by helical scan grinding. In the helical scan grinding process, grinding is performed in a state of tilting the grinding stone in a diagonal direction with respect to the outer circumferential edge serving as a surface to be polished. Therefore, the surface to be polished and the grinding stone come into contact through line contact rather than point contact. When the helical scan grinding process is performed, less heat is applied to the surface to be polished. Abrasive grains, dust and the like generated during polishing are also discharged in a direction having a predetermined slope from the outer circumferential edge. Therefore, it is possible to suppress the damage to the outer circumferential edge, and to effectively suppress the occurrence of edge defects.

The helical scan grinding process is a polishing method that hardly damages the surface to be polished, due to its configuration. Therefore, it is possible to increase the polishing rate. In other words, it is possible to increase productivity.

In the SiC epitaxial wafer of the present invention, the number of edge defects within a range of 1 mm from the outer circumferential edge on the step-flow growth starting side in the SiC single crystal substrate is not more than 30 defects/m. In other words, it is possible to further reduce the edge exclusion, and to increase the effective area ratio for producing chips, thereby improving the yield of the semiconductor chips.

DESCRIPTION OF EMBODIMENTS

A method for manufacturing a SiC epitaxial wafer and a SiC epitaxial wafer to which the present invention is applied will be described below in detail with appropriate reference to the drawings.

In the drawings used in the following description, characteristic portions and components may be shown in an enlarged manner in some cases for the sake of simplicity in order to facilitate understanding of the characteristics of the present invention, and the dimensional ratio or the like of each constituent may be different from that employed in reality. Materials, dimensions, and the like illustrated in the following description are merely examples, and the present invention is not limited thereto and can be carried out with appropriate modifications without departing from the scope and spirit of the invention.

Figure 1:
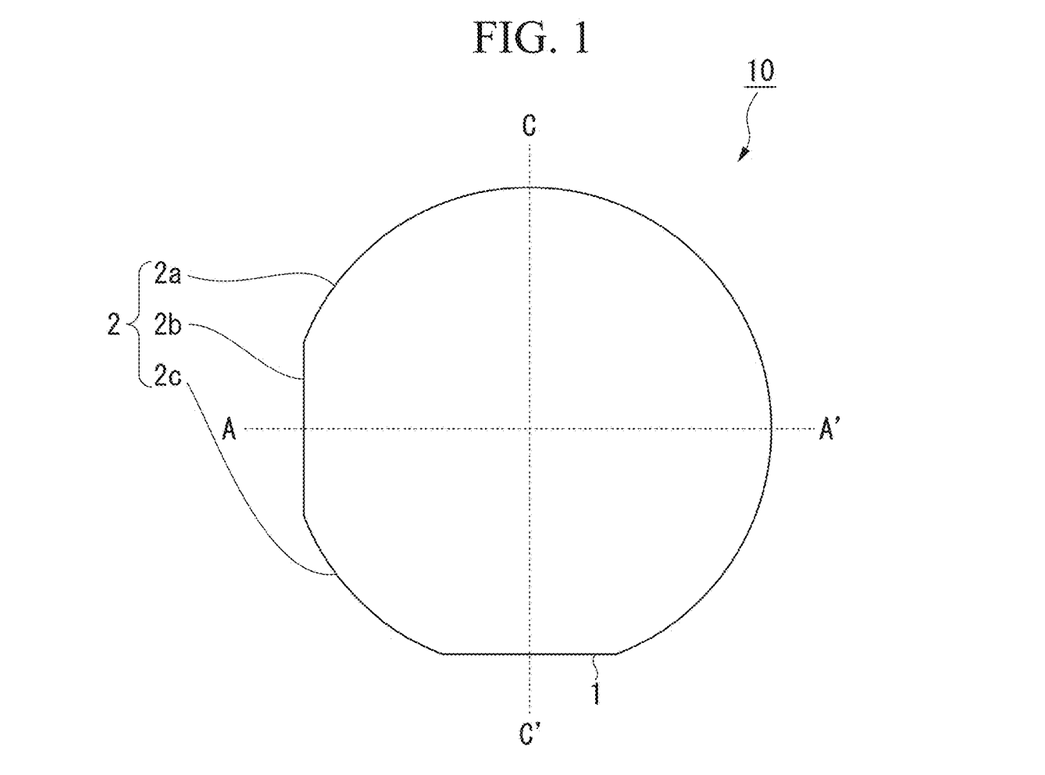
FIG. 1 is a schematic plan view schematically showing a 4H—SiC single crystal substrate having an off angle of 4° in a <11-20> direction.

FIG. 1 is a schematic plan view schematically showing a 4H—SiC single crystal substrate having an off angle of 4° in a <11-20> direction. As shown in FIG. 1, a SiC single crystal substrate 10 is a circular substrate made of a single crystal of SiC, and generally has an orientation flat (hereinafter, referred to as "OF") 1 and an index flat (hereinafter, referred to as "IF") 2b. The OF 1 is made to specify the crystal orientation by cutting out a portion of the outer circumference of the circular semiconductor substrate in a direction parallel to the crystal orientation. The IF 2b is formed on the outer circumference of the circular semiconductor substrate together with the OF 1 in order to determine the front and back. However, in order to determine the front and back of the semiconductor substrate, the OF 1 and the IF 2b need to be formed at positions so that they are asymmetrical with respect to the center of the semiconductor substrate. In the 4H—SiC single crystal substrate, the OF 1 is parallel to the <11-20> direction, and the IF 2b is perpendicular to the <11-20> direction.

Figure 2:
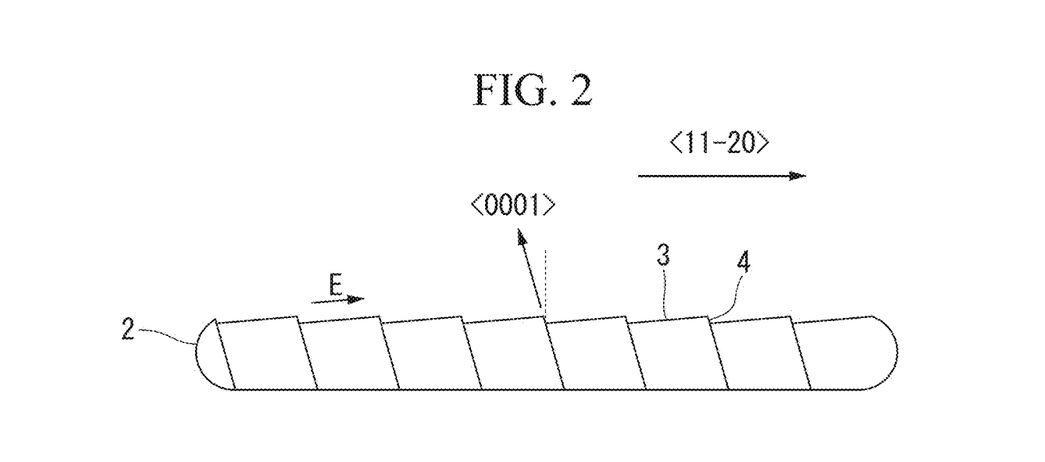
FIG. 2 is a schematic sectional view schematically showing a cross section obtained by cutting the 4H—SiC single crystal substrate having an off angle of 4° in the <11-20> direction along the A-A' plane (see FIG. 1).

FIG. 2 is a schematic sectional view schematically showing a cross section obtained by cutting the 4H—SiC single crystal substrate having an off angle of 4° in the <11-20> direction along the A-A' plane (see FIG. 1). As shown in FIG. 2, the SiC single crystal substrate 10 having an off angle includes a terrace surface 3 and a step portion 4. In the SiC single crystal substrate 10, an epitaxial film is grown in a step-flow manner. Therefore, the epitaxial film is grown in the direction E in FIG. 2. In other words, the epitaxial film is grown from each step portion 4 along the terrace surface 3.

Figure 3:
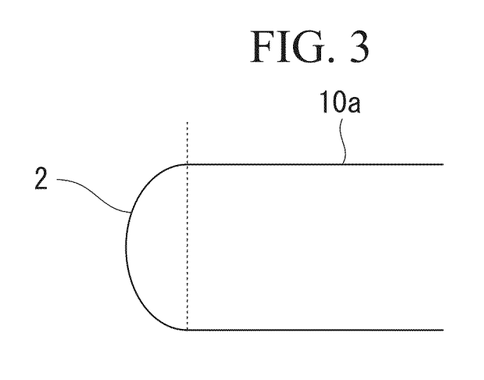
FIG. 3 is a schematic sectional view schematically showing an example of an outer circumferential edge.
Figure 4:
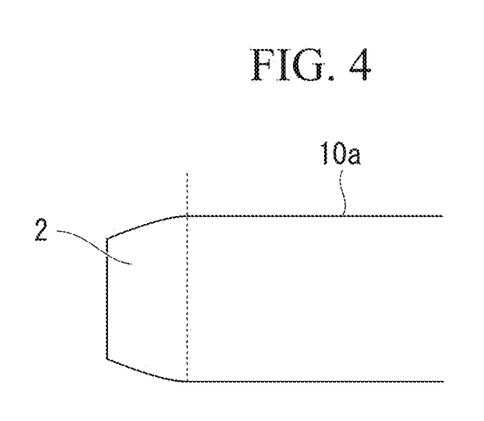
FIG. 4 is a schematic sectional view schematically showing another example of an outer circumferential edge.

An outer circumferential edge 2 on the starting side of step-flow growth in the SiC single crystal substrate 10 refers to an outer peripheral portion on the left hand side of the center line C that runs through the center of the SiC single crystal substrate 10 and is perpendicular to the <11-20> direction in FIG. 1. The outer circumferential edge 2 is composed of an arc outer circumference upper portion 2a, the IF 2b, and an arc outer circumference lower portion 2c. The outer circumferential edge 2 may be chamfered in its cross section, or may be formed into a curved shape. As shown in FIG. 3, when the outer circumferential edge 2 forms a circular arc, the outer circumferential edge is defined as a portion in which the circular arc is formed from the point where an upper surface 10a of the SiC single crystal substrate 10 starts to draw the arc (portion on the left hand side of the dotted line in the drawing). In addition, as shown in FIG. 4, when the outer circumferential edge 2 is chamfered, the outer circumferential edge is defined as a portion including a surface inclined downward from the upper surface 10a of the SiC single crystal substrate 10 and a surface perpendicular to the upper surface 10a of the SiC single crystal substrate 10 (portion on the left hand side of the dotted line in the drawing).

Figure 5:
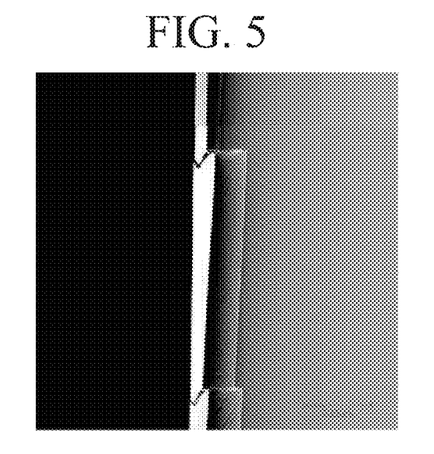
FIG. 5 is an image of an index flat portion of the SiC single crystal substrate after forming a SiC epitaxial film which is taken with a confocal microscope.

FIG. 5 is an image of the IF surface of the SiC single crystal substrate after forming a SiC epitaxial film which is taken with a confocal microscope. The right side in the drawing is the side of the SiC single crystal substrate that contains defects in the form of cracks from the boundary surface. These are edge defects and can hardly be confirmed in the SiC single crystal substrate before the epitaxial growth. On the other hand, they are highlighted and can be easily confirmed after the film formation. Such edge defects may become a cause for the detachment of the oxide film and the production of cracks and the like, when forming a device on a SiC epitaxial wafer.

The edge defects characteristically occur in the outer circumferential edge 2 on the starting side of the step-flow growth in the SiC single crystal substrate 10. In the case where the IF is provided in the outer circumferential edge on the starting side of the step-flow growth in the SiC single crystal substrate 10, the edge defects also occur in the IF portion. The edge defects occur in a predetermined region of the SiC epitaxial wafer. Therefore, the present inventors have considered that the edge defects have occurred in accordance with the following principle.

In general, as shown in FIG. 2, when growing an epitaxial film on the SiC single crystal substrate 10, the epitaxial film is grown in the direction E (from left to right in the drawing). If a defect is present in the step portion 4 serving as the starting of growth, the effects are imposed on the grown epitaxial film. For example, it is thought that triangular defects and the like also occur under the effect of the growth direction of the epitaxial film.

The edge defects characteristically occur in the outer circumferential edge 2 on the starting side of the step-flow growth in the SiC single crystal substrate 10. That is, similarly to the defect mechanism as described above, it can be considered that the outer circumferential edge 2 on the starting side of the step-flow growth is damaged, and the defects caused by the damage have occurred.

This assumption is consistent with the fact that the edge defects cannot be confirmed in the SiC single crystal substrate before the epitaxial growth, but can be confirmed more easily after the film formation. In the SiC single crystal substrate 10 before the epitaxial film growth, damage to the outer circumferential edge for causing defects is very little and cannot be found easily. However, when the SiC epitaxial film grows, the epitaxial film is grown in a step-flow growth mode using the damage as a starting point. Therefore, it is considered that the defects become highlighted to be easily discovered.

This is also consistent with the fact that the edge defects are not observed on the downstream side of the step-flow growth, that is, an outer circumferential edge on the right side in FIG. 1. The outer circumferential edge on the downstream side of the step-flow growth does not become a starting point of the step-flow growth. That is, even if the edge on the downstream side of the step-flow growth is damaged before growth of the epitaxial film, this damage is not highlighted and does not generate the edge defects during the epitaxial growth.

Accordingly, the present inventors have conducted intensive studies to suppress the edge defects. The method for manufacturing a SiC epitaxial wafer according to an embodiment of the present invention includes: a rough polishing step for subjecting an outer circumferential edge on the starting side of step-flow growth in the SiC single crystal substrate to rough polishing before forming the SiC epitaxial layer; and a final polishing step for further polishing for finish. These polishing steps may be performed by at least polishing the outer circumferential edge on the starting side of the step-flow growth, and may also be performed over the entire surface of the outer circumferential edge.
(Rough Polishing Step)

The SiC single crystal substrate can be made, for example, from a SiC bulk single crystal ingot produced by the sublimation method or the like. More specifically, the SiC substrate can be obtained by the following procedure. The outer circumference of the ingot is ground and processed into a cylindrical shape, and then sliced into a disk shape by using a wire saw or the like, and an outer peripheral portion of the sliced substrate is chamfered to be finished with a predetermined diameter.

Conventionally, the edge defects have not been discovered, or they have not been regarded as a problem even if they have been discovered. Therefore, after producing a SiC single crystal substrate, polishing or the like to the edge thereof has not been particularly performed. Even if the polishing or the like has been performed, it is performed in order to adjust the shape of the outer circumferential edge, and a SiC single crystal substrate that has gone through a predetermined polishing step leading to the elimination of the edge defects has not been available.

The rough polishing step is a step of adjusting the shape of the outer circumferential edge of the SiC single crystal substrate. Due to the rough polishing step, it is possible to remove a damaged portion caused by the substrate forming process after grinding or slicing the outer circumference of the ingot that is present in the outer circumferential edge 2 on the starting side of the step-flow growth. The term "damaged portion" refers to a region having a width of about several hundreds of micrometers from the outer circumferential edge on the starting side of the step-flow growth.

The polishing method in the rough polishing step is not particularly limited. A normal outer circumference grinding process and helical scan grinding process using a grindstone that is used for polishing the Si substrate or the like, a slurry-based polishing method, a tape-based polishing method using a lapping film, or the like can be used.

The normal outer circumference grinding process using a grindstone is a method for grinding the edge of the SiC single crystal substrate in a state where the rotation axis of the polishing grindstone is made parallel to the rotational axis of the SiC single crystal substrate which will be described later. The helical scan grinding process using a grindstone is a method for grinding the edge of the SiC single crystal substrate in a state where the rotation axis of the polishing grindstone is inclined by a predetermined angle with respect to the rotational axis of the SiC single crystal substrate in a tangential direction of the outer circumference of the SiC single crystal substrate which will be described later. The tape-based polishing method is a polishing method by rotating a lapping film formed with fixed abrasive grains and pressing a surface to be polished onto the lapping film. The slurry-based polishing method is a polishing method for polishing a surface to be polished by using a polishing liquid containing a polishing agent. In any of the processing methods, the substrate is preferably processed while being rotated in order to maintain the circular shape.

When using a grinding stone for the rough polishing step, it is preferable to use a metal bonded grinding stone. The metal bonded grinding stone is a hard grinding stone. Therefore, the grinding stone is hardly deformed by the impact due to the processing, and it is easy to maintain the stability of the end face shape. The metal bonded grinding stone has a high processing rate and is highly superior also in terms of productivity.

In the rough polishing step, it is preferable to perform the normal outer circumference grinding process. In the normal outer circumference grinding process, since the contact pressure with the surface to be polished is large, it is possible to increase the throughput.

A polishing abrasive grain used in the rough polishing step preferably has a grain size from #400 to #1,500, and more preferably from #400 to #600. If the polishing abrasive grains in the rough polishing step have a grain size within the range described above, it is possible to obtain the set end face shape with a high throughput.

The surface roughness Ra of the outer circumferential edge of the SiC single crystal substrate after the rough polishing step is preferably 1,000 nm or less, more preferably 500 nm or less, and still more preferably 200 nm or less. The smaller the surface roughness Ra, the better, and the lower limit may not be particularly set, although there is no particular problem if the surface roughness is 1 nm or more.

By adjusting the surface roughness Ra of the outer circumferential edge of the SiC single crystal substrate to some extent in the rough polishing step, it is possible to prevent the SiC single crystal substrate from being damaged in the final polishing step. The surface roughness is preferably as small as possible.
(Final Polishing Step)

The final polishing step is a step of subjecting the outer circumferential edge of the SiC single crystal substrate after the rough polishing step to final polishing. The final polishing process removes the damaged portion generated in the outer circumferential edge in the rough polishing step.

The final polishing process is not particularly limited as long as it is a method that does not deeply damage the outer circumferential edge. As the method that does not deeply damage the outer circumferential edge, more specifically, it is preferable to carry out polishing with the tape-based polishing method using polishing abrasive grains of high numbers or the slurry-based polishing method, or to conduct helical scan grinding. Among them, the helical scan grinding process is particularly preferred. By employing the helical scan grinding process, the grain size of the polishing abrasive grains can be reduced, and the polishing can be performed efficiently. This is because, since the effective spacing of the abrasive grains with respect to the workpiece is narrowed by the inclination of the grindstone, the surface roughness can be further improved by the helical scan grinding process than the normal outer circumference grinding process or the like even when a grindstone having the same grain size is used.

Figure 6:
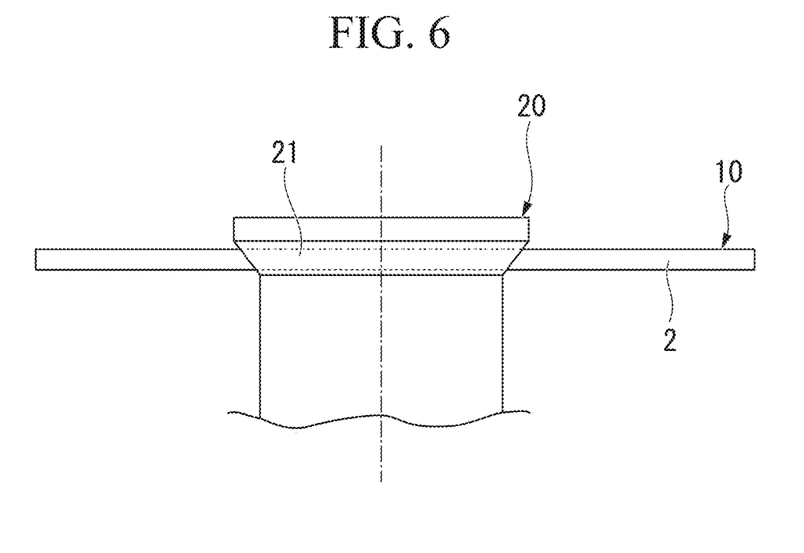
FIG. 6 is a schematic diagram schematically showing a normal outer circumference grinding process using a polishing grindstone.
Figure 7:
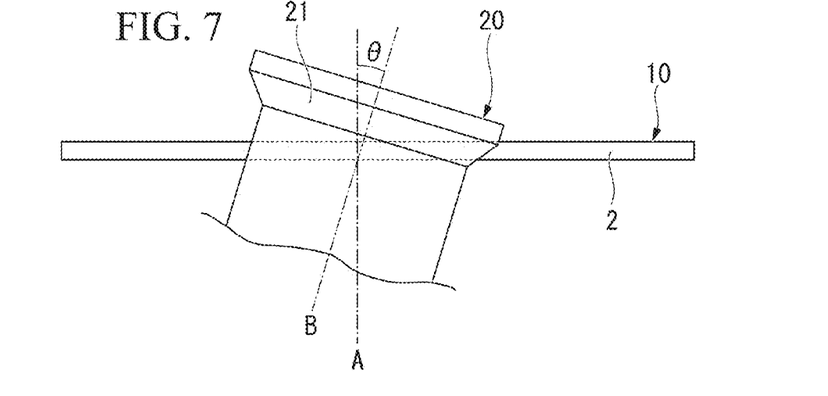
FIG. 7 is a schematic diagram schematically showing a helical scan grinding process using a polishing grindstone.

The helical scan grinding process is a grinding method in which the rotation axis of the polishing grindstone is inclined in a tangential direction of the outer circumference of the SiC single crystal substrate with respect to the rotational axis direction of the SiC single crystal substrate. The helical scan grinding process may be referred to as a helical scan polishing process due to the convention to selectively use the terms such as polishing or grinding based on the processing state, or may be more generalized and referred to as helical scan processing. FIG. 6 is a schematic diagram schematically showing a normal outer circumference grinding process using a polishing grindstone. FIG. 7 is a schematic diagram schematically showing a helical scan grinding process using a polishing grindstone. FIG. 6 and FIG. 7 are schematic diagrams of the SiC single crystal substrate 10 seen from the polishing grindstone side in a plane perpendicular to the rotational axis of the SiC single crystal substrate, and a polishing grindstone 20 is installed on the SiC single crystal substrate (near side in the drawings).

As shown in FIG. 6 and FIG. 7, the expression "tangential direction of the outer circumference of the SiC single crystal substrate" refers to a direction parallel to the straight line formed by the SiC single crystal substrate when seeing the SiC single crystal substrate 10 in plan view from the outer circumferential edge surface side. In other words, the expression "inclined in a tangential direction of the outer circumference of the SiC single crystal substrate with respect to the rotational axis direction of the SiC single crystal substrate" means that, with respect to the rotational axis direction A of the SiC single crystal substrate in FIG. 7, the polishing grindstone may be inclined to the right side or to the left side in the drawing.

The helical scan grinding process is employed in some cases, for example, for chamfering the Si substrate as in Patent Document 2 and Patent Document 3. However, since the edge defects described in the present invention do not occur in the Si substrate, it is impossible to arrive at the present invention from the descriptions provided in Patent Documents 2 and 3.

In the normal outer circumference grinding process, as shown in FIG. 6, a polishing surface 21 of the polishing grindstone 20 is disposed parallel to the SiC single crystal substrate 10. In other words, the polishing surface 21 and the SiC single crystal substrate 10 are brought into point contact. On the other hand, in the helical scan grinding process, as shown in FIG. 7, the polishing surface 21 is placed with a certain angle with respect to the SiC single crystal substrate 10. In other words, the polishing surface 21 and the SiC single crystal substrate 10 are brought into line contact. Therefore, in the case of helical scan grinding, the contact area with the SiC single crystal substrate is large. For this reason, it is possible to suppress the damage to the outer circumferential edge of the SiC single crystal substrate. More specifically, it is possible to suppress the heat or the like due to friction on the ground plane. Adverse effects by the particles generated during polishing can also be suppressed. The particles are discharged along the outer circumferential edge of the SiC single crystal substrate 10 in the normal outer circumference grinding process, while the particles are discharged in a direction having a predetermined angle from the outer circumferential edge of the SiC single crystal substrate 10 in the helical scan grinding process. Therefore, in the helical scan grinding process, it is possible to prevent the outer circumferential edge from being damaged due to reintroduction of these particles between the polishing surface 21 and the outer circumferential edge.

As shown in FIG. 7, in the helical scan grinding process, grinding is performed by inclining a rotational axis B of a polishing grindstone by an angle of θ in a tangential direction of the outer circumference of the SiC single crystal substrate, with respect to a rotational axis A of the SiC single crystal substrate. The rotational axis of the SiC single crystal substrate is perpendicular to the surface of the substrate. The angle θ is preferably from 1° to 45° and more preferably from 5° to 10°.

If the angle θ is greater than 45°, the angle of the polishing surface 21 with respect to the operating direction of the polishing grindstone 20 increases, and there is a concern of damaging the outer circumferential edge 2 on the step-flow growth starting side when operating the polishing grindstone 20. If the angle is less than 1°, the effects of the helical scan grinding process cannot be sufficiently exhibited, and it becomes difficult to suppress the damage.

In those cases where polishing is performed by operating the polishing grindstone 20 along the SiC single crystal substrate 10, the operation speed of the polishing grindstone 20 is preferably from 1 m/min to 100 μm/min. and more preferably from 3 μm/min to 20 μm/min.

When the operating speed of the polishing grindstone 20 is less than 1 μm/min, it is difficult to increase productivity since the final polishing process takes too much time. When operating speed of the polishing grindstone 20 is greater than 20 μm/min, great damage may be caused along the outer circumferential edge even when only a small amount of particles is introduced between the polishing surface 21 and the SiC single crystal substrate 10.

The rotational speed of the SiC substrate 10 is preferably from 0.1 rpm to 10 rpm, and more preferably from 0.5 rpm to 2 rpm.

If the rotational speed is within this range, it is possible to increase productivity while suppressing the damage.

The rotational speed of the polishing grindstone 20 is preferably from 1,000 rpm to 100,000 rpm, and more preferably from 10,000 rpm to 50,000 rpm.

When the rotational speed of the polishing grindstone 20 is less than 1,000 rpm, it is difficult to sufficiently reduce the surface roughness Ra of the polishing surface.

When the rotational speed of the polishing grindstone 20 is greater than 100,000 rpm, the rotational speed is too fast. For this reason, the polishing grindstone 20 vibrates, and it becomes difficult to keep the distance between the polishing surface 21 and the outer circumferential edge of the SiC single crystal substrate 10 at a constant level. Accordingly, there is a case where the polishing surface 21 and the outer circumferential edge of the SiC single crystal substrate 10 collide, and the outer circumferential edge of the SiC single crystal substrate 10 is damaged.

The grain size of the polishing abrasive grain used in the helical scan grinding process is preferably equal to or greater than #2,000, more preferably equal to or greater than #3,000, and still more preferably equal to or greater than #5,000.

When the grain size of the polishing abrasive grain is less than #2,000, the outer circumferential edge 2 on the step-flow growth starting side may be damaged due to the large size of abrasive grains, and it is difficult to obtain satisfactory surface roughness Ra.

When performing the final polishing process by a method other than the helical scan grinding process, it is preferable to use polishing abrasive grains having a higher grain size than the polishing abrasive grain used in the case of helical scan grinding.

It is preferable to use a resin-bonded grinding stone as a grindstone used in the helical scan grinding process. The resin-bonded grinding stone is a soft grindstone capable of reducing the grain size of abrasive grains, which is preferable because it has a feature of enabling processing with less damage and good shape accuracy.

The surface roughness Ra of the outer circumferential edge of the SiC single crystal substrate after the final polishing step is preferably from 1 nm to 50 nm, and more preferably from 1 nm to 20 nm. The surface roughness Ra can be measured by a non-contact measurement method. In the helical scan grinding process, a surface having a smaller surface roughness Ra can be obtained than in the case of normal processing even if a grindstone having the same grain size is used. By ensuring that the grain size of the polishing abrasive grain to be used in the helical scan grinding process is equal to or greater than #2,000, it is possible to realize a surface roughness Ra of not more than 50 nm.

The surface roughness Ra is not a direct indicator of the edge defect. This is because, even when the surface roughness Ra is excellent, if the internal SiC single crystals are damaged, edge defects occur due to the damage. However, when polishing is performed so as not to damage the outer circumferential edge 2 on the step-flow growth starting side, the surface roughness Ra also becomes small inevitably. Therefore, if the outer circumferential edge 2 on the step-flow growth starting side after the final polishing step has a surface roughness Ra within this range, it can be used as one of the indicators capable of confirming that the occurrence of edge defects is suppressed to a low level at a stage prior to growing an epitaxial film.

The outer circumferential edge of the substrate after the final polishing step may be further subjected to edge polishing. The edge polishing process may be a process used for edge processing of a general semiconductor. Since the damage to cause the edge defects is suppressed by the final polishing step, the edge defects never occur again even if the edge polishing process is conducted. By performing the edge polishing process, it is possible to further reduce the surface roughness Ra of the edge.

(Growth Process of SiC Epitaxial Film)

Growth of a SiC epitaxial film is not particularly limited, and it is possible to use a conventional method. For example, it is possible to use a chemical vapor deposition method or the like of depositing and growing a layer on the surface of the heated SiC single crystal substrate while supplying a raw material gas into an evacuable chamber (film forming chamber). As the raw material gas, silane ($SiH_4$), dichlorosilane ($SiCl_2H_2$), trichlorosilane ($SiCl_3$), silicon tetrachloride ($SiCl_4$) and the like can be used as a Si source, and propane ($C_3H_8$), ethane ($C_2H_6$) and the like can be used as a carbon (C) source. As a carrier gas, those containing hydrogen ($H_2$) and the like can be used.

As shown in FIG. 2, the epitaxial film grows in a step-flow growth mode toward the direction E. As described above, since polishing is performed without damaging the outer circumferential edge on the step-flow growth starting side in the final polishing step, it is possible to grow an epitaxial film in which edge defects are suppressed.

The frequency of occurrence of edge defects differs for each SiC single crystal substrate. However, as described above, since the edge defects can be hardly confirmed in the SiC single crystal substrate before the epitaxial growth and can be confirmed more easily after forming the epitaxial film, it is difficult to make a judgement before the film formation.

On the other hand, the method for manufacturing an epitaxial wafer according to the present invention is capable of easily removing the edge defects, only by performing a simple method as described above, and is therefore highly preferred from the viewpoint of productivity.

(Epitaxial Wafer)

The epitaxial wafer of the present invention is a SiC epitaxial wafer obtained by forming a SiC epitaxial layer on a SiC single crystal substrate having an off angle, and the number of edge defects within a range of 1 mm from the outer circumferential edge on a step-flow growth starting side in the SiC single crystal substrate which is averaged throughout the entire circumference of the wafer is not more than 30 defects/m. This can be determined by dividing the number of edge defects with the length of the wafer outer circumference. It can also be expressed as a density per unit area in a region of 1 mm of the outer circumferential edge of not more than 3.0 defects/$cm^2$. When it is defined by focusing only on the outer peripheral portion (half circle) of the half of the wafer on the upstream side of the step-flow growth where the edge defects occur, since the length is halved, in a substrate formed with an off angle and in a half circle to become the upstream side of the step-flow growth, it can also be expressed as not more than 60 defects/m and not more than 6.0 defects/$cm^2$, respectively.

Since the edge defects are observed as irregularities with a shape in which a flat surface different from the peripheral surface is present in a straight line, the number of edge defects can be counted and determined with an optical microscope. A plurality of defects may occur locally at high density or may occur at intervals of several millimeters, and have a characteristic that the occurrence mode is not uniform. Therefore, it is suitable to express the number of edge defects by dividing the number of defects measured along the outer circumference with the length of the outer circumference, and expressing as the number of defects per unit length. The number of the edge defects was counted by observing a 1 mm region from the outer circumferential edge on the step-flow growth starting side over a half circumference of the SiC epitaxial wafer using a microscope.

The expression "within a range of 1 mm from the outer circumferential edge on the step-flow growth starting side in the SiC single crystal substrate" means a region from the outer circumference of the SiC single crystal substrate up to 1 mm, which is a portion on the left side of the center line C in FIG. 1. The reason for the observation over the half circumference of the SiC epitaxial wafer using a microscope is because the edge defects do not occur over the half circumference corresponding to the outer peripheral portion on the opposite side of the step-flow growth starting side.

The number of counts does not basically change even if measured for the entire circumference.

As described above, the inventors of the present invention have taken notice of the edge defects characteristically occurring in the outer circumferential edge on the step-flow growth starting side in the SiC single crystal substrate for the first time.

The edge defects may become a cause for the detachment of the oxide film and the production of cracks and the like, when forming a device on a SiC epitaxial wafer. A portion having an edge defect cannot be used as an effective portion of the chip, and the width of the edge exclusion cannot be sufficiently reduced. The present inventors have found that it is effective to reduce the edge defects.

In a conventional epitaxial wafer, edge defects grow from the damaged portion of the outer circumferential edge on the step-flow growth starting side in the SiC single crystal substrate due to the step-flow growth. Therefore, 30 or more edge defects were present within a range of 1 mm from the outer circumferential edge on the step-flow growth starting side in the SiC single crystal substrate (that is, equal to or more than 30 defects/m). However, in the present invention, the present inventors have found that the edge defects can be suppressed by subjecting the outer circumferential edge on the step-flow growth starting side in the SiC single crystal substrate to a predetermined polishing process.

The edge defects occur frequently in the range of about 1 mm from the outer circumferential edge on the step-flow growth starting side. As shown in FIG. 5, the edge defects have a cracked shape in a direction substantially parallel to the step-flow growth direction starting from the outer circumferential edge on the step-flow growth starting side. The length thereof in a direction parallel to the step-flow growth direction is about 100 to 500 μm, and the width is about several micrometers. The edge defects have an irregular shape of about several nanometers to 1 μm or less in the depth direction of the epitaxial film, depending on the thickness of the epitaxial film.

In the epitaxial wafer of the present invention, the number of edge defects within a range of 1 mm from the outer circumferential edge on the step-flow growth starting side in the SiC single crystal substrate is not more than 30 defects/m. The epitaxial wafer of the present invention is capable of suppressing the detachment of the oxide film and the production of cracks and the like, and reducing the width of the edge exclusion, when forming a device on the SiC epitaxial wafer.

The thickness of the epitaxial film can be made to be from 1 μm to 100 μm. The thicker the epitaxial film, the greater the degree of unevenness of the edge defects. Since the edge defects become prominent when the thickness of the epitaxial film is equal to or more than 5 μm, the effect of the present invention to reduce it is remarkable.

Preferred embodiments of the present invention have been described above. However the present invention is not limited to these embodiments. Furthermore, configuration additions, omissions, substitutions, and other modifications are possible within the scope of the present invention described in the claims.

EXAMPLES

Hereinafter, the advantageous effects of the present invention will be described in more detail with reference to Examples. The present invention is not limited to the following Examples and can be carried out with appropriate modifications without departing from the spirit and scope of the invention.

Example 1

As a SiC single crystal substrate, a 4-inch SiC single crystal substrate having an off angle of 4° was prepared. An outer circumferential edge of the SiC single crystal substrate was subjected to a normal outer circumference grinding process by using a polishing grindstone having a grain size of #600. Next, a helical grinding process was conducted with respect to a tangential direction of the outer circumference of the SiC single crystal substrate 10, by using a polishing grindstone having a grain size of #3,000. Conditions for the helical grinding process were such that the rotational axis of the grindstone was inclined by 5°, the operating speed of the grinding stone was 10 μm/min, and the rotational speed of the grinding stone was 35,000 rpm. For the helical grinding process, W-GM-4200 manufactured by Tosei Engineering Corp. was used. The finished surface at this time was a mirror surface and had a surface roughness Ra of 27 nm.

Figure 8:
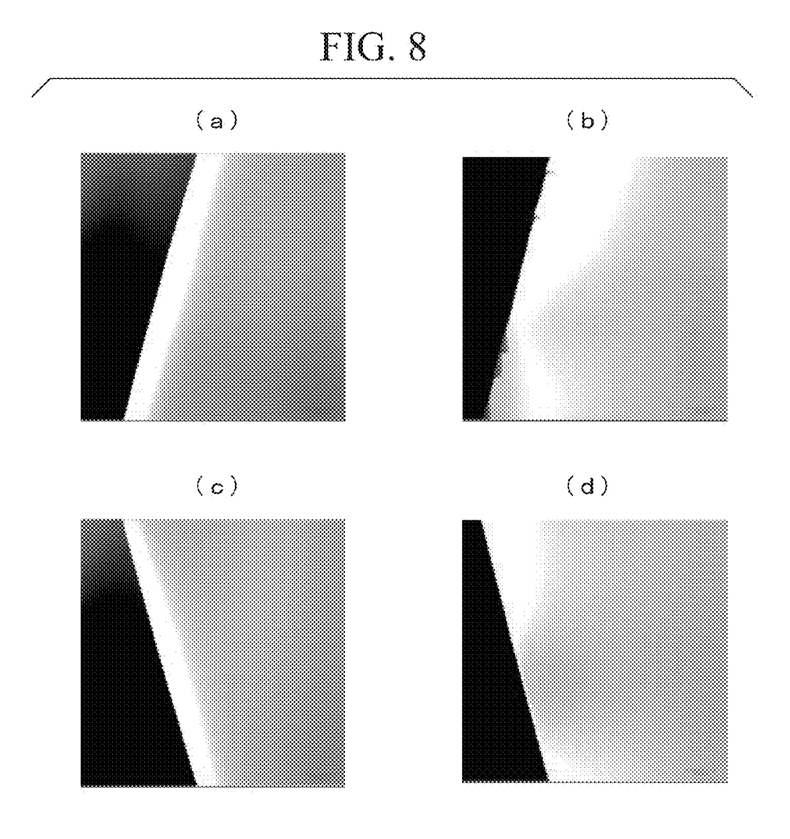
FIG. 8 is confocal microscope images of the outer circumferential edge on the step-flow growth starting side before and after the epitaxial film formation in Example 1, (a) shows an upper portion of the outer circumference of a circular arc before the epitaxial growth, (b) shows a lower portion of the outer circumference of a circular arc before the epitaxial growth, (c) shows an upper portion of the outer circumference of a circular arc after the epitaxial growth, and (d) shows a lower portion of the outer circumference of a circular are after the epitaxial growth.

Then, the Si surface of the SiC single crystal substrate serving as a film-forming surface was subjected to the CMP process, and an epitaxial film was grown to a thickness of 10 μm using a chemical vapor deposition apparatus while supplying silane as a Si-based gas and propane as a C-based gas. FIG. 8 is confocal microscope images of the outer circumferential edge on the step-flow growth starting side before and after the epitaxial film formation in Example 1, (a) shows an upper portion of the outer circumference of a circular arc before the epitaxial growth, (b) shows a lower portion of the outer circumference of a circular arc before the epitaxial growth, (c) shows an upper portion of the outer circumference of a circular arc after the epitaxial growth, and (d) shows a lower portion of the outer circumference of a circular arc after the epitaxial growth.

In this case, the number of edge defects within a range of 1 mm from the outer circumferential edge on the step-flow growth starting side in the SiC single crystal substrate was 22 defects/m.

Example 2

Figure 9:
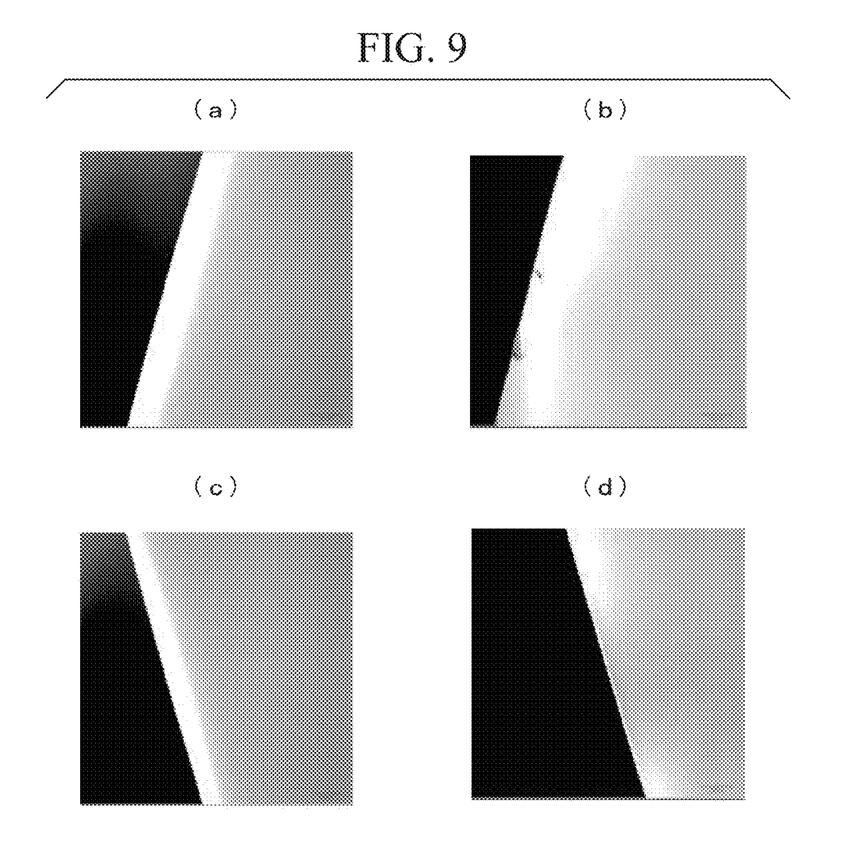
FIG. 9 is confocal microscope images of the outer circumferential edge on the step-flow growth starting side before and after the epitaxial film formation in Example 2, (a) shows an upper portion of the outer circumference of a circular arc before the epitaxial growth, (b) shows a lower portion of the outer circumference of a circular arc before the epitaxial growth, (c) shows an upper portion of the outer circumference of a circular arc after the epitaxial growth, and (d) shows a lower portion of the outer circumference of a circular are after the epitaxial growth.

An edge surface after the helical grinding process was further subjected to an edge polishing (EP) process with a slurry-based polishing method, which was the only point different from Example 1. FIG. 9 is confocal microscope images of the outer circumferential edge on the step-flow growth starting side before and after the epitaxial film formation in Example 2, (a) shows an upper portion of the outer circumference of a circular arc before the epitaxial growth, (b) shows a lower portion of the outer circumference of a circular arc before the epitaxial growth, (c) shows an upper portion of the outer circumference of a circular arc after the epitaxial growth, and (d) shows a lower portion of the outer circumference of a circular arc after the epitaxial growth. The finished surface at this time was a mirror surface and had a surface roughness Ra of 10 nm or less.

Comparative Example 1

Figure 10:
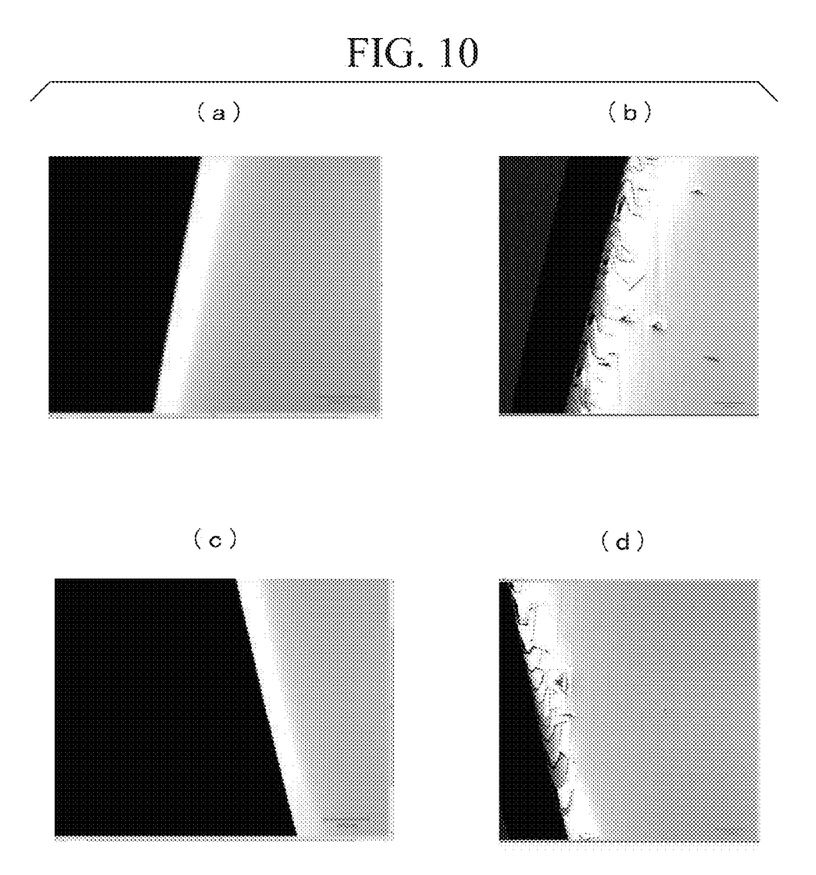
FIG. 10 is confocal microscope images of the outer circumferential edge on the step-flow growth starting side before and after the epitaxial film formation in Comparative Example 1, (a) shows an upper portion of the outer circumference of a circular arc before the epitaxial growth, (b) shows a lower portion of the outer circumference of a circular arc before the epitaxial growth, (c) shows an upper portion of the outer circumference of a circular arc after the epitaxial growth, and (d) shows a lower portion of the outer circumference of a circular arc after the epitaxial growth.

Comparative Example 1 differs from Example 1 only in that the final polishing step was not performed. FIG. 10 is confocal microscope images of the outer circumferential edge on the step-flow growth starting side before and after the epitaxial film formation in Comparative Example 1, (a) shows an upper portion of the outer circumference of a circular arc before the epitaxial growth, (b) shows a lower portion of the outer circumference of a circular arc before the epitaxial growth, (c) shows an upper portion of the outer circumference of a circular arc after the epitaxial growth, and (d) shows a lower portion of the outer circumference of a circular arc after the epitaxial growth. The finished surface at this time was a rough surface and had a surface roughness Ra of 89 nm. The number of edge defects within a range of 1 mm from the outer circumferential edge on the step-flow growth starting side in the SiC single crystal substrate was 166 defects/m.

Comparative Example 2

Figure 11:
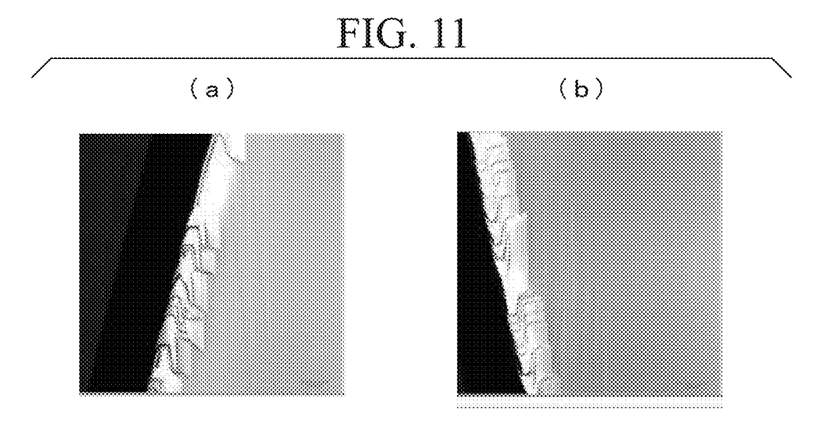
FIG. 11 is confocal microscope images of the outer circumferential edge on the step-flow growth starting side before and after the epitaxial film formation in Comparative Example 2, (a) shows an upper portion of the outer circumference of a circular arc after the epitaxial growth, and (b) shows a lower portion of the outer circumference of a circular arc after the epitaxial growth.

Comparative Example 2 differs from Comparative Example 1 only in that additional mirror processing is performed using a rubber-bonded wheel. FIG. 11 is confocal microscope images of the outer circumferential edge on the step-flow growth starting side before and after the epitaxial film formation in Comparative Example 2, (a) shows an upper portion of the outer circumference of a circular arc after the epitaxial growth, and (b) shows a lower portion of the outer circumference of a circular arc after the epitaxial growth. The finished surface at this time was a mirror surface and had a surface roughness Ra of 15 nm or less. The number of edge defects within a range of 1 mm from the outer circumferential edge on the step-flow growth starting side in the SiC single crystal substrate was 118 defects/m.

Comparative Example 3

Figure 12:
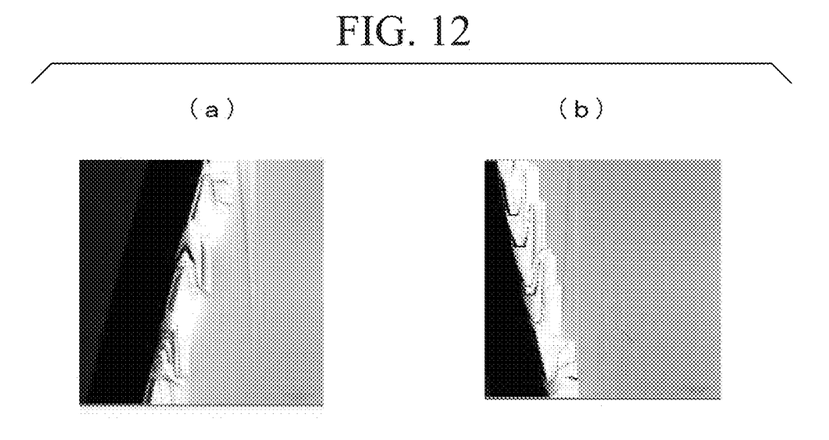
FIG. 12 is confocal microscope images of the outer circumferential edge on the step-flow growth starting side before and after the epitaxial film formation in Comparative Example 3, (a) shows an upper portion of the outer circumference of a circular arc after the epitaxial growth, and (b) shows a lower portion of the outer circumference of a circular arc after the epitaxial growth.

Comparative Example 3 is different from Comparative Example 2 in that a slurry-based edge polishing (EP) process was employed for the mirror processing. FIG. 12 is confocal microscope images of the outer circumferential edge on the step-flow growth starting side before and after the epitaxial film formation in Comparative Example 3, (a) shows an upper portion of the outer circumference of a circular arc after the epitaxial growth, and (b) shows a lower portion of the outer circumference of a circular arc after the epitaxial growth. The finished surface at this time was a mirror surface and had a surface roughness Ra of 15 nm or less. The number of edge defects within a range of 1 mm from the outer circumferential edge on the step-flow growth starting side in the SiC single crystal substrate was 74 defects/m.

Comparative Example 4

Figure 13:
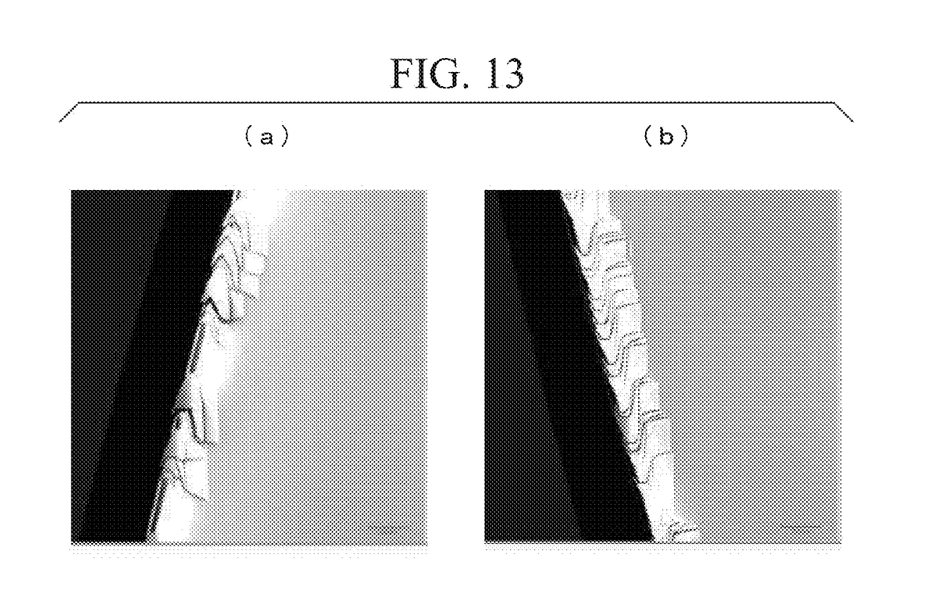
FIG. 13 is confocal microscope images of the outer circumferential edge on the step-flow growth starting side before and after the epitaxial film formation in Comparative Example 4, (a) shows an upper portion of the outer circumference of a circular arc after the epitaxial growth, and (b) shows a lower portion of the outer circumference of a circular arc after the epitaxial growth.

Comparative Example 4 is different from Comparative Example 2 in that a tape-based edge polishing (EP) process using a lapping film was employed for the mirror processing. FIG. 13 is confocal microscope images of the outer circumferential edge on the step-flow growth starting side after the epitaxial film formation in Comparative Example 4, (a) shows an upper portion of the outer circumference of a circular arc after the epitaxial growth, and (b) shows a lower portion of the outer circumference of a circular arc after the epitaxial growth.

In this case, the number of edge defects within a range of 1 mm from the outer circumferential edge on the step-flow growth starting side in the SiC single crystal substrate was 138 defects/m. The finished surface at this time was a mirror surface and had a surface roughness Ra of 15 nm or less.

The conditions of Examples 1 and 2 and Comparative Examples 1 to 4 are summarized below in Table 1.

TABLE 1

| | Rough polishing | | Final polishing | | | | | Defect density after epitaxial growth (defects/m) |
|---|---|---|---|---|---|---|---|---|
| | Polishing method | Grain size | Polishing method | Grain size | EP | Finish | Ra (nm) | |
| Ex. 1 | Normal grinding | #600 | Helical scan grinding | #3,000 | Not performed | Mirror surface | 27 | 22 |
| Ex. 2 | Normal grinding | #600 | Helical scan grinding | #3,000 | Slurry-based | Mirror surface | <10 | 16 |
| Comp. Ex. 1 | Normal grinding | #600 | — | — | Not performed | Rough surface | 89 | 166 |
| Comp. Ex. 2 | Normal grinding | #600 | — | — | Rubber-bonded wheel | Mirror surface | Up to 10 | 118 |
| Comp. Ex. 3 | Normal grinding | #600 | — | — | Slurry-based | Mirror surface | Up to 10 | 74 |
| Comp. Ex. 4 | Normal grinding | #600 | — | — | Tape-based | Mirror surface | Up to 10 | 138 |

Edge defects are hardly observed in the edge after the epitaxial growth in Examples 1 and 2. On the other hand, it can be seen that edge defects occurred vigorously in the edge after the epitaxial growth in Comparative Examples 1 to 4.

REFERENCE SIGNS LIST

1: OF; 2: Outer circumferential edge on step-flow growth starting side; 2a: Upper portion of outer circumference of circular arc; 2b: IF; 2c: Lower portion of outer circumference of circular arc; 3: Terrace surface; 4: Step portion; 10: SiC single crystal substrate; 10a: Top surface; 20: Polishing grindstone; 21: Polishing surface

The invention claimed is:

1. A method for manufacturing a SiC epitaxial wafer which is a method for manufacturing a SiC epitaxial wafer that forms a SiC epitaxial layer on a SiC single crystal substrate having an off angle, the method comprising:
   a rough polishing step for subjecting an outer circumferential edge on a starting side of step-flow growth in the SiC single crystal substrate to rough polishing before forming the SiC epitaxial layer; and
   a final polishing step for further polishing for finish, wherein the polishing for finish is performed by a grinding process in which a rotational axis of a polishing grindstone is inclined in a tangential direction of an outer circumference of the SiC single crystal substrate to be polished, with respect to a rotational axis of the SiC single crystal substrate to be polished, and a machined surface roughness (Ra) after performing the final polishing step is from 1 nm to 50 nm.

2. The method for manufacturing a SiC epitaxial wafer according to claim 1, wherein the final polishing step is performed by inclining the rotational axis of the polishing grindstone by 1° to 45° in the tangential direction of the outer circumference of the SiC single crystal substrate to be polished, with respect to the rotational axis of the SiC single crystal substrate to be polished.

3. The method for manufacturing a SiC epitaxial wafer according to claim 1, wherein the final polishing step is performed using a resin-bonded grinding stone.

4. The method for manufacturing a SiC epitaxial wafer according to claim 1, wherein a polishing abrasive grain used in the final polishing step has a grain size of #2,000 to #5,000.

5. The method for manufacturing a SiC epitaxial wafer according to claim 1, wherein the rough polishing step is performed using a metal bonded grinding stone.

6. The method for manufacturing a SiC epitaxial wafer according to claim 1, wherein a polishing abrasive grain used in the rough polishing step has a grain size of #400 to #1,500.

7. A SiC epitaxial wafer which is a SiC epitaxial wafer obtained by forming a SiC epitaxial layer on a SiC single crystal substrate having an off angle, wherein the number of edge defects within a range of 1 mm from an outer circumferential edge on a starting side of step-flow growth in the SiC single crystal substrate is not more than 30 defects/m, wherein the edge defects are observed as irregularities with a shape in which a flat surface different from the peripheral surface is present in a straight line, and wherein a machined surface roughness (Ra) of the outer circumferential edge on a starting side of step-flow growth in the SiC single crystal substrate is from 1 nm to 50 nm.

* * * * *